United States Patent

Mogi et al.

[11] Patent Number: 5,850,689
[45] Date of Patent: Dec. 22, 1998

[54] METHOD AND APPARATUS FOR SUPPORTING PRINTED BOARD

[75] Inventors: Seiichi Mogi, Neyagawa; Wataru Hirai, Osaka; Muneyoshi Fujiwara, Katano; Osamu Okuda; Hirokazu Honkawa, both of Hirakata, all of Japan

[73] Assignee: Matsushita Electric Industrial Co., Ltd., Osaka, Japan

[21] Appl. No.: 586,314

[22] Filed: Jan. 17, 1996

[30] Foreign Application Priority Data

Jan. 17, 1995 [JP] Japan .................................. 7-004894

[51] Int. Cl.⁶ .............................. H05K 3/30; B23P 19/00
[52] U.S. Cl. ................. 29/834; 29/740; 29/759; 29/833
[58] Field of Search .............................. 29/833, 834, 760, 29/759, 840, 564.1, 740

[56] References Cited

U.S. PATENT DOCUMENTS

| | | | |
|---|---|---|---|
| 4,202,092 | 5/1980 | Shibasaki et al. | |
| 4,528,747 | 7/1985 | Hoffman et al. | 29/834 |
| 4,733,462 | 3/1988 | Kawatani | 29/834 |
| 5,007,162 | 4/1991 | Weeber | 29/834 |
| 5,216,804 | 6/1993 | Rosier | 29/834 |
| 5,222,293 | 6/1993 | Ozimeh et al. | 29/834 X |
| 5,504,988 | 4/1996 | Avery et al. | 29/834 X |

Primary Examiner—Carl J. Arbes
Attorney, Agent, or Firm—Wenderoth, Lind & Ponack

[57] ABSTRACT

A method for supporting a printed board. Includes a first step of conveying to a specified position by a conveying a printed board having a first reference hole and a second reference hole device a for setting a position and posture thereof. A second step stops the conveyed printed board at the specified position with a stop member. A third step inserts a first reference pin provided at the specified position into the first reference hole of the stopped printed board. A fourth step inserts a second reference pin into the second reference hole of the printed board. The second reference pin is movable in parallel to a mounting surface of the printed board and in any arbitrary direction relative to the first reference pin. A fifth step pinches the printed board to hold the position and posture thereof of a holding device with the first reference pin and the second reference pin both inserted. A sixth step draws out, after the fifth step, at least one reference pin of the first reference pin and the second reference pin from its corresponding reference hole. A seventh step mounts after the sixth step, an electronic component onto the printed board under the control of a control unit.

10 Claims, 15 Drawing Sheets

METHOD AND APPARATUS FOR SUPPORTING PRINTED BOARD

BACKGROUND OF THE INVENTION

The present invention relates to a method and apparatus for supporting a printed board, appropriate for electronic component mounters.

Electronic component mounters are classified roughly into two types. One type of electronic component mounter is as shown in FIG. 1 where an X-Y robot 2 is planarly movable in parallel to the mounting surface of a printed board 1. A suction nozzle member 3 provided in the X-Y robot 2 sucks and holds an electronic component 4 and then mounts it onto the printed board which is fixed at a specified position. The other type of electronic component mounter is as shown in FIGS. 2 and 3. A groove portion 8 of an arbitrary curve is provided on the circumference of a cylindrical member 6. A plurality of nozzle members 7 each including a roller 9 that runs along the groove portion 8, are mounted on the circumference of the cylindrical member 6. These nozzle members 7 suck and hold an electronic component 4, rotate along the circumference of the cylindrical member 6 and then mount the electronic component 4 onto a printed board 1 at a specified position. In this type, an X-Y table member 5 planarly movable in a direction perpendicular to a center axis A1 of the cylindrical member 6 moves to a mounting position while holding the printed board 1, and mounts the electronic component 4 thereon. These two types, different as they are in whether the printed board 1 is fixed at a specified position or moved to a mounting position, adopt a common method for supporting the printed board 1. This being the case, the conventional printed board supporting method and apparatus will be described below with reference to the detailed figures of FIGS. 4 through 6.

Referring first to FIG. 4, a printed board 1 has two reference holes 10 and 11 (one hole 11 is a long hole), where reference pins 12 and 13, fittable to the reference holes 10, 11, are inserted into them, respectively, so that the printed board 1 can be regulated in position and posture. As the printed board 1 comes in various sizes, the reference holes 10, 11 can vary in position correspondingly. Therefore, at least one of the two reference pins 12, 13 is provided with a pin shifting mechanism 14 in which the reference pin 13 can move along a rail 14a for positioning the reference pin 13 so that the pin 13 may be inserted at any arbitrary position. Hereinafter, the reference pin 13 equipped with this mechanism 14 is referred to as a second reference pin 13, while the other 12 is referred to as a first reference pin 12.

The operation flow of the prior art method and apparatus for supporting the printed board is now described. When the mounting of electronic components onto a printed board is completed at step 17 in FIG. 6, conveyor members 16 discharge the printed board at step 18 in FIG. 6. A stopper member 15 for stopping the printed board that is subsequently conveyed moves up from a position below the board conveying path along the conveyor members 16 to a position in the path. FIG. 7A shows the conveyor members 16 in detail, which comprise conveyor rails 23a, 23b, conveyor belts 24, and drive units (not shown) for driving the conveyor belts 24 along the conveyor rails 23a, 23b. The printed board 1 is placed on and conveyed by the conveyor belts 24 driven by the drive units such as motors. Further, a width adjustment mechanism is provided in order to handle a variety of board sizes. The conveyor rail 23b on the rear side of the apparatus is required to be provided with this mechanism so that the conveyor rail 23b can move closer to or away from the conveyor rail 23a depending on the size of the board. Therefore the stopper member 15, the first reference pin 12, and the second reference pin 13 have been conventionally provided in proximity to the conveyor rail 23a on the front side of the apparatus. Also, FIG. 7B is a sectional view of the apparatus as viewed from its front side (left side of the drawing sheet of FIG. 7A). FIG. 8 is a detailed view of the stopper member 15. In a stop operation a the contact portion 15a of the stopper member 15, connected to the upper end of a bracket 30b fixed to a piston rod 30a of an air cylinder 30, is moved up by the air cylinder 30 so as to be positioned on a plane in which the printed board 1 is conveyed. The contact portion 15a makes contact with the conveyed printed board 1, whereby the printed board 1 can be stopped. For the printed board 1 contacting with and stopped by the stopper member 15 at steps 19, 20 in FIG. 6, the first reference pin 12 and the second reference pin 13 are inserted from below the mounting surface into the first reference hole 10 and the second reference hole 11, respectively, so that the position and posture of the printed board 1 can be regulated. Immediately after this, a support member 26 having support pins 26a, having moved up from below the mounting surface, makes contact with the lower surface of the printed board 1 and then lifts up the printed board 1 so as to pinch end portions of the printed board 1 against conveyor rails 25, thereby holding and fixing the printed board 1 at step 21 in FIG. 6.

FIGS. 8 and 9 show each of the reference pins 12, 13 in detail. Each of the reference pins 12, 13 includes a roller 33 abutting against the lower surface of a back board 27 (detailed in FIG. 10) forming a part of the support member 26, a guide 31 on which the roller 33 is rotatably supported and on which the first or second reference pin 12, 13 is fixed, and a spring 32 attached between a lower end of the guide 31 and the mounting portion 37. Since each of the reference pins 12, 13 and the roller 33 are attached to the guide 31, and the mounting portion 37 and the guide 31 are connected to each other via the spring 32, the roller 33 abuts against the lower surface of the back board 27 with the urging force of the spring 32 so as to prevent the reference pin 12 or 13 from moving up. However, when the support member 26 enters an operation of holding the printed board 1 and then the back board 27 moves up, the reference pin 12 or 13 moves up so as to be inserted into the reference hole 10 or 11, whereafter the holding operation is completed.

FIG. 10 shows the support member 26 having a lifting mechanism 29 for moving the printed board 1 up and down in detail. It comprises an air cylinder 41, links 40a, 40b, shafts 35a, 35b, a link 39, links 36a, 36b, rollers 38, the mounting portion 37 for pivotably or rotatably mounting the air cylinder 41 and the shafts 35a, 35b etc. thereto, a base seat 28 for supporting the back board 27, guides 34 for guiding the lift of the back board 27, the back board 27, and the support pins 26a. The link 40a is rotatable around a center of the shaft 35a and the link 40b is rotatable around a center of the shaft 35b. One end of the link 40a is pivotably connected to the end of the piston rod 41a of the air cylinder 41 and the other end of the link 40a is pivotably connected to one end of the link 39. The other end of the link 39 is pivotably connected to one end of the link 40b. Thus, the air cylinder 41 is connected to the link 40b, and further to the link 40b via the link 39. Accordingly, when the piston rod 41a of the air cylinder 41 is moved back and forth, the link 40a rotates about the shaft 35a, the rotation being transferred to the link 40b via the link 39 so that the shaft 35b rotates. The links 36a, 36b are further respectively fixed to the shafts 35a, 35b, so that the base seat 28 is moved up and down along the guides 34 via the rollers 38 fixed at the other ends of the links 36a, 36b. That is, while the rollers 38 rotatably move in holes 28a of lower projections 28b of the base seat 28, the links 36a, 36b rotate around the center of the shafts 35a, 35b in accordance with the rotation of the shafts 35a, 35b and thus move the base seat 28 up or down via the rollers 38 and the lower projections 28b of the base seat 28. Accordingly, the back board 27 and the support pins 26a fixed to the base seat 28 are allowed to move up and down. When the operation of holding the printed board 1 is completed, the process of electronic component mounting is started at step 22 in FIG. 6, in which state the first reference pin 12 and the second reference pin 13 are also kept inserted into the reference holes 10, 11 without being drawn out. Further, the sequence of operations up to this point is carried out with a suitable timing by a control unit (not shown) provided at a specified position.

The reason why the two reference pins 12, 13 have traditionally been inserted into the reference holes 10, 11 from below the mounting surface of the printed board 1 is to avoid the possible interference between pickup nozzle and the reference pins 12, 13 or the pin shifting mechanism 14 in mounting electronic components, and to ensure the widest possible mountable range of component mounting.

With the constitution of the prior art, it is required to assure a certain space for the first reference pin 12, the second reference pin 13, and the pin shifting mechanism 14 provided below the printed board 1. This has resulted in a concern over the support of the printed board in the space being in sufficient. Furthermore, in the case of the X-Y table member, the pin shifting mechanism is incorporated regardless of the fact that a reduction of weight is desired, and this has problematically caused an increase of weight, complicated the construction and arrangement and increased cost.

SUMMARY OF THE INVENTION

An object of the present invention is to provide a method and apparatus for supporting a printed board which can obviate the need for a complicated pin shifting mechanism and the need for ensuring a space for movement which have been required in the prior art apparatus and method.

In accomplishing these and other aspects, according to a first aspect of the present invention, there is provided a method for supporting a printed board, comprising:

a first step of conveying to a specified position a printed board having a first reference hole and a second reference hole for setting the position and posture thereof;

a second step of stopping the conveyed printed board at the specified position;

a third step of inserting a first reference pin provided at such a specified position as to be fittable to the first reference hole of the stopped printed board;

a fourth step of inserting a second reference pin to the second reference hole of the printed board, the second reference pin being movable in parallel to a mounting surface of the printed board and in any arbitrary directions relative to the first reference pin;

a fifth step of pinching the printed board to hold the position and posture thereof with the first reference pin and the second reference pin both inserted;

a sixth step of drawing out, after the fifth step, at least one reference pin of the first reference pin and the second reference pin from its corresponding reference hole; and a seventh step of mounting, after the sixth step, an electronic component onto the printed board.

According to a second aspect of the present invention, there is provided a method for supporting a printed board wherein in the third step and the fourth step, at least one reference pin of the first reference pin and the second reference pin is inserted into its corresponding reference hole from above the mounting surface of the printed board.

According to a third aspect of the present invention, there is provided a an eighth step, between the sixth step and seventh step, of replacing the drawn-out reference pin with an electronic component suction nozzle to mount the suctioned component onto the printed board in the seventh step.

According to a fourth aspect of the present invention, there is provided the method for supporting a printed board wherein in the third step and the fourth step, at least one reference pin of the first reference pin and the second reference pin is inserted into its corresponding reference hole from above the mounting surface of the printed board. The printed board is securely supported by supporting pins arranged at almost the whole area corresponding to a lower surface of the printed board, except for an area where the other reference pin of the first reference pin and the second reference pin is present in the seventh step.

According to a fifth aspect of the present invention, there is provided an apparatus for supporting a printed board, comprising a conveying device for conveying to a specified position a printed board having a first reference hole and a second reference hole for setting the position and posture thereof.

A stop member stops the printed board at the specified position.

A first reference pin is provided at a specified position and is fittable to the first reference hole and movable perpendicularly to a mounting surface of the printed board.

A second reference pin is fittable to the second reference hole and movable perpendicularly to the mounting surface. It is provided in a device movable in parallel to the mounting surface and in any arbitrary direction relative to the first reference pin.

A holding device pinches end portions of the printed board to hold the position and posture thereof.

A control unit controls operations of the conveying device, the stop member, the first and second reference pins, and the holding device in a sequence of operations.

According to a sixth aspect of the present invention, there is provided the above apparatus for supporting a printed board, wherein the second reference pin is provided by a robot movable in parallel to the mounting surface and perpendicularly to the mounting surface of the printed board. As the device movable in parallel to the mounting surface and in any arbitrary direction relative to the first reference pin.

According to a seventh aspect of the present invention, there is provided the above apparatus for supporting a printed board, wherein the second reference pin is removably retained by the robot. The second reference pin is replaceable with an electronic component suction nozzle for suctioned the component to mount the sucked component onto the printed board.

According to an eighth aspect of the present invention, there is provided the above apparatus for supporting a printed board, wherein the first reference pin comprises a device movable perpendicularly to the mounting surface which is provided outside a table which holds the printed board and is movable in parallel to the mounting surface.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
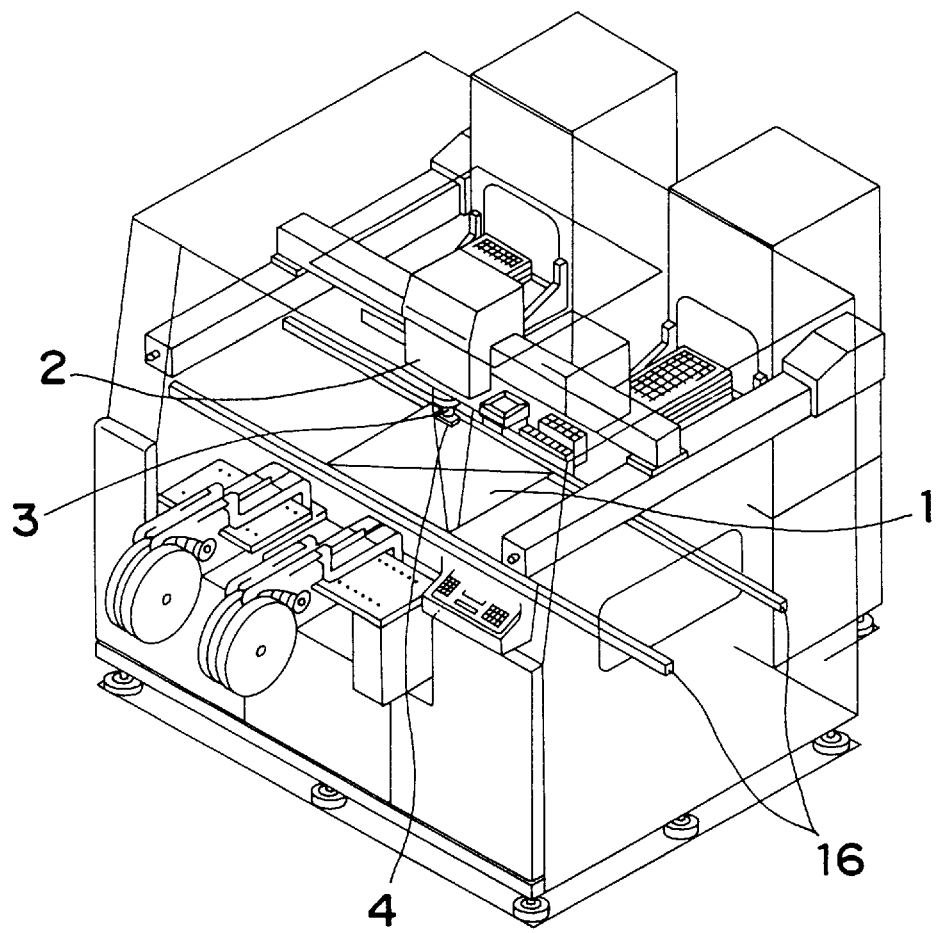
FIG. 1 is a partly transparent perspective view of an electronic component mounter of a first type.

Before the description of the present invention proceeds, it is to be noted that like parts are designated by like reference numerals throughout the accompanying drawings.

Embodiments of the present invention and their operations will be described below with reference to the accompanying drawings.

Figure 11:
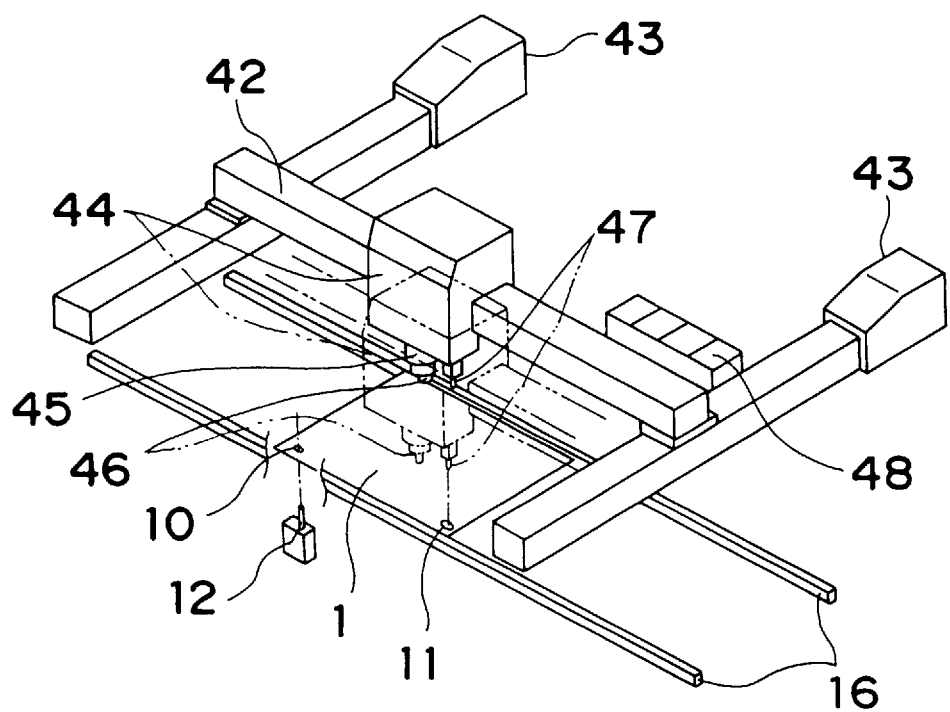
FIG. 11 is a perspective view of an X-Y robot in a first embodiment of the present invention.
Figure 12:
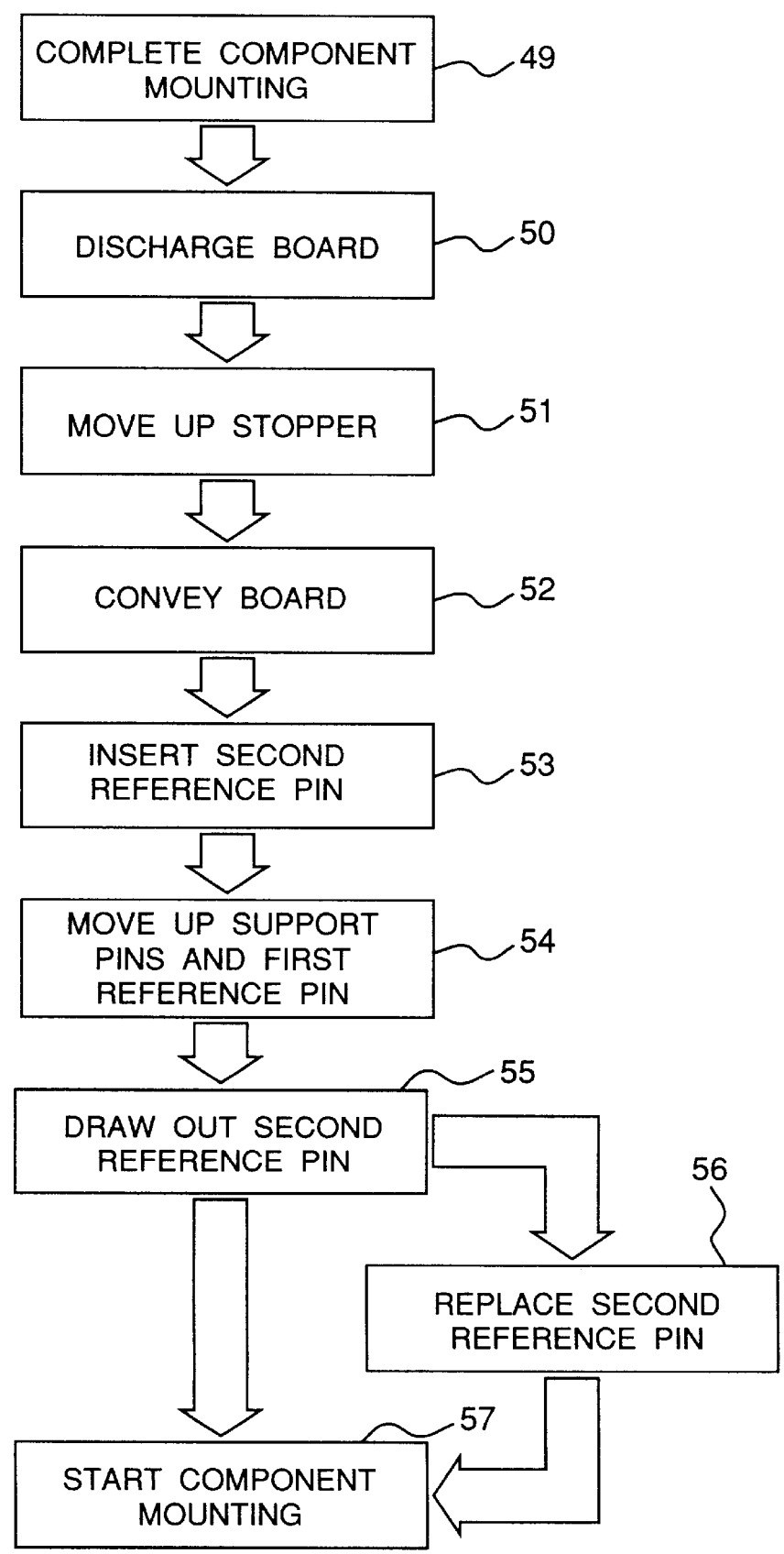
FIG. 12 is a flow chart showing the operation of a printed board supporting apparatus according to the first embodiment of the present invention.
Figure 13:
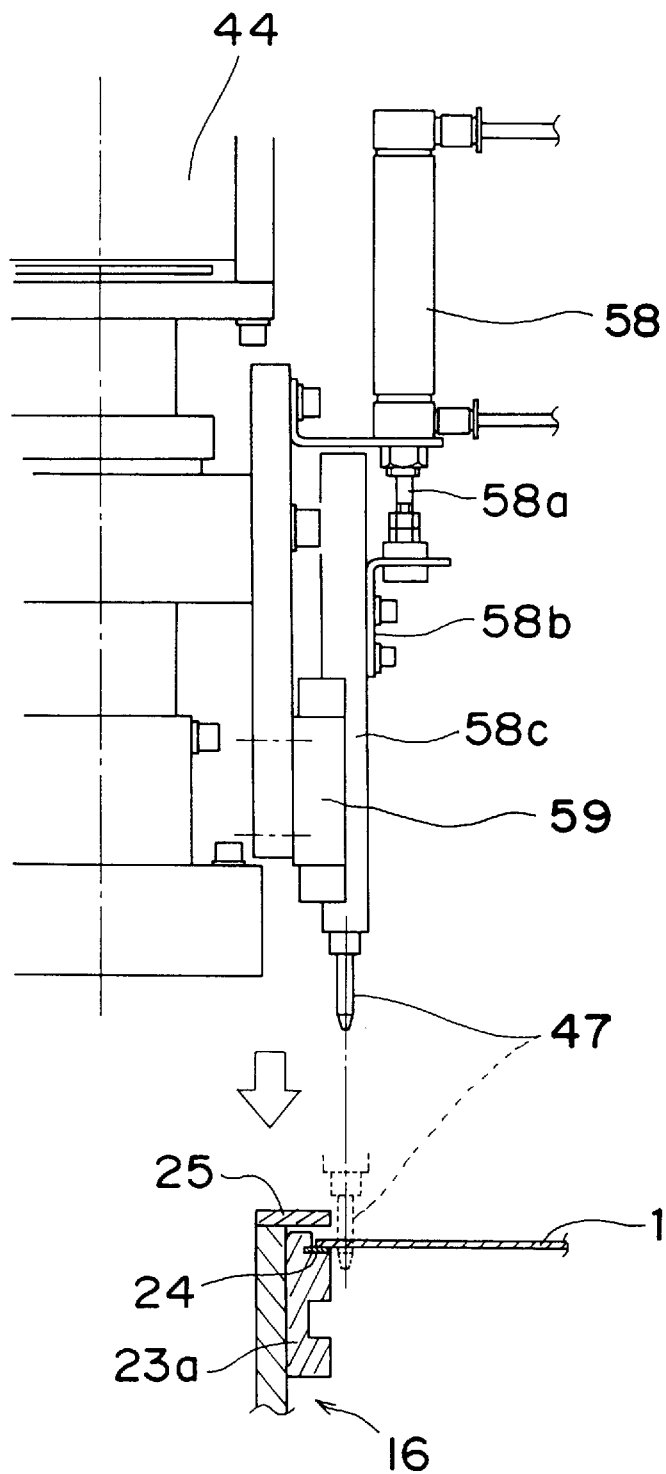
FIG. 13 is a schematic view showing the arrangement of a second reference pin provided in the X-Y robot of the first embodiment of the present invention.

FIG. 1 shows an electronic component mounter on which an X-Y robot 2, planarly movable in parallel to the mounting surface of a printed board 1 is provided, and FIG. 11 is a perspective view of an X-Y robot 102 according to a first embodiment of the present invention. The X-Y robot 102, which is an apparatus for mounting suctioned electronic components onto the printed board 1 which is fixedly held in position, comprises an X-axis unit 42 and Y-axis units 43 that are provided horizontally to the mounting surface and perpendicularly to each other. The unit 42 and 43 are equipped with drive units, a head member 44 provided on the X-axis unit 42, a nozzle mounting portion 45 having a means provided in the head member 44 for moving in a direction perpendicular to the mounting surface, a nozzle 46, and a second reference pin 47 having a similar means. The X-axis unit 42 is movable linearly on the Y-axis units 43, and the head member 44 is movable linearly on the X-axis unit 42. Accordingly, the head member 44 is movable planarly to any arbitrary position within the movable range of the X-axis unit 42 and the Y-axis units 43. The operation is described below. When the mounting of electronic components onto a printed board is completed at step 49 in FIG. 12, the conveyor members 16 discharge the printed board at step 50 in FIG. 12, and a stopper member 15 for stopping the printed board 1 that is subsequently conveyed moves up at step 51 in FIG. 12. When the printed board 1 that is conveyed makes contact with the stopper member 15 and thereby stops at step 52 in FIG. 12, the second reference pin 47 provided in the head member 44 that has stood by above the second reference hole 11 of the printed board 1 lowers down so as to be inserted into the second reference hole 11 at step 53 in FIG. 12. In this connection, FIG. 13 shows in detail the second reference pin 47 provided in the head member 44. The second reference pin 47 comprises an air cylinder 58 having a cylinder rod 58a and a driving rod 58c connected to the cylinder rod 58a via an L-shaped member 58b, a guide 59 for guiding the movement of the driving rod 58c, and a pin 47 fixed to the lower end of the driving rod 58c. The pin 47 is movable linearly in the direction of the guide 59, and the operation of the pin 47 is driven by the air cylinder 58. Subsequently, as a back board 27 provided below the mounting surface of the printed board 1 moves up, the first reference pin 12 moves up, so that the first reference pin 12 is inserted into the first reference hole 10 of the printed board 1, thus regulating the position and posture of the printed board 1. Immediately after this, the support pins 26a provided on the back board 27 make contact with the lower surface of the printed board 1. The support pins 26a further lift the printed board 1 and pinch it with the conveyor rails 25, thereby holding and fixing the printed board 1 at step 54 in FIG. 12. The way of operating and constructing of the conveyor members 6, the support member 26, and the first reference pin 12 described above are the same as those of the prior art, and their details have already been described with the prior art. When the holding of the printed board 1 is completed, the head member 44 draws out the second reference pin 47 from the second reference hole 11 and starts either the process of mounting the electronic component 4 sectionally held by the nozzle 46, or the process of suctioned an electronic component 4 to be mounted, next at step 57 in FIG. 12.

As described previously, the nozzle mounting portion 45 provided in the head member 44 has the lifting mechanism for mounting the electronic component 4 onto the mounting surface of the printed board 1.

Figure 18:
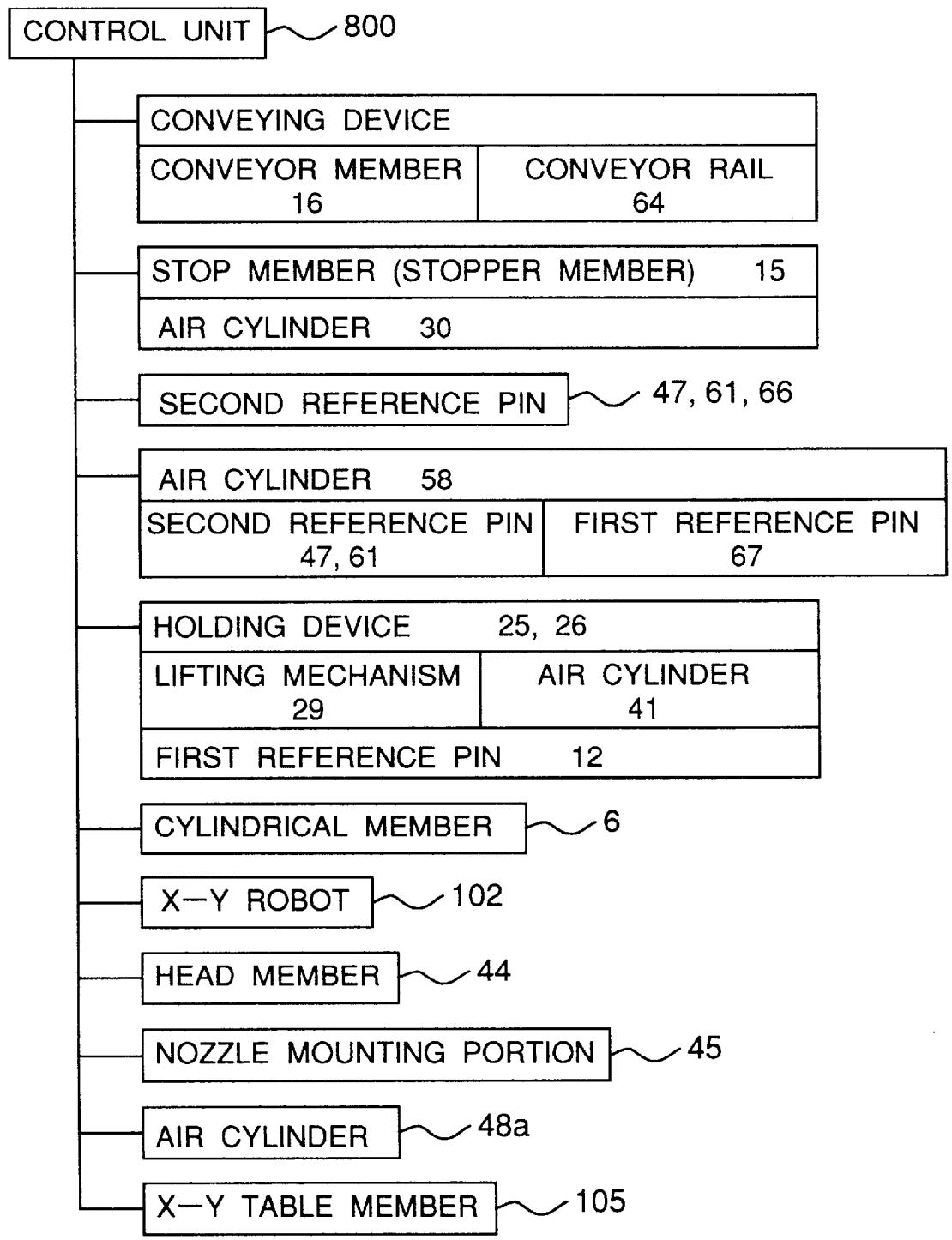
FIG. 18 is a block diagram of a control section of the apparatuses in the embodiments.

The above sequential operations are carried out at the most suitable timing by a control unit 800 provided at a specified position, as shown in FIG. 18.

Figure 14A:
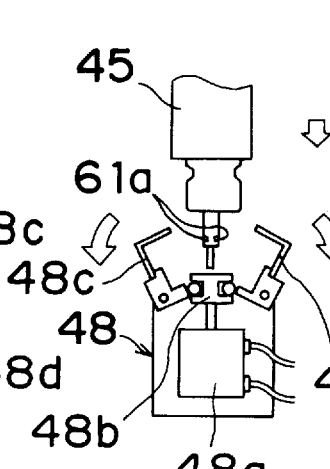
FIGS. 14A, 14B, 14C, 14D, 14E, and 14F are explanatory views showing a nozzle replacement operation in a second embodiment of the present invention.
Figure 14B:
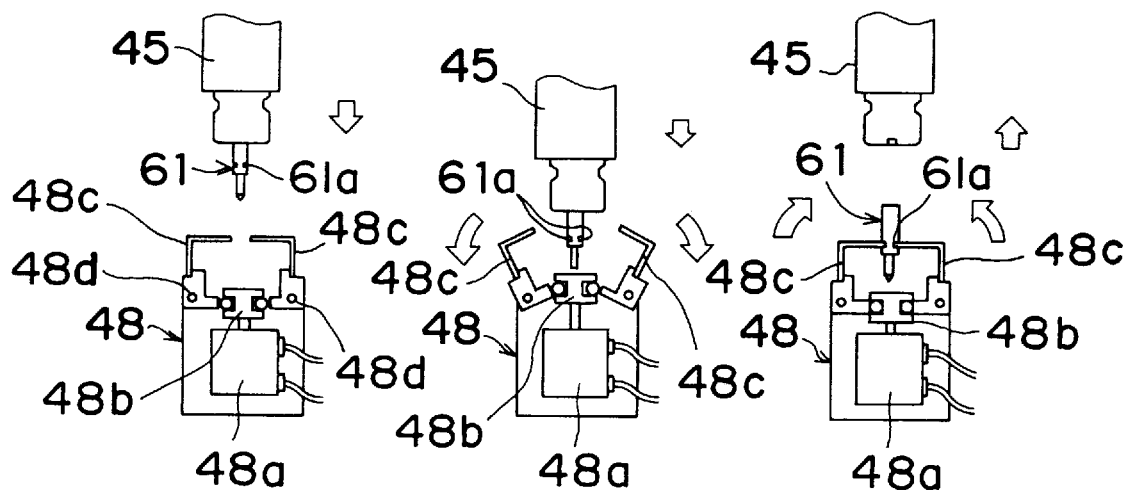
Figure 14C:
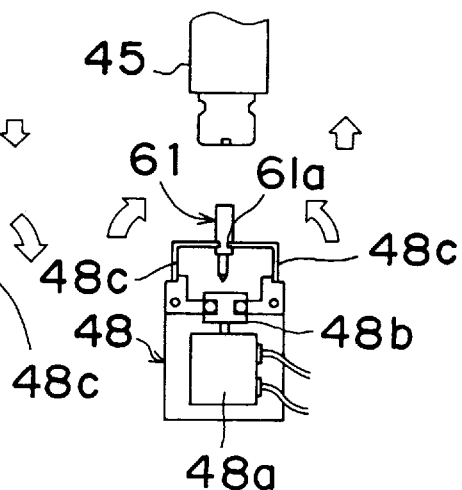
Figure 14D:
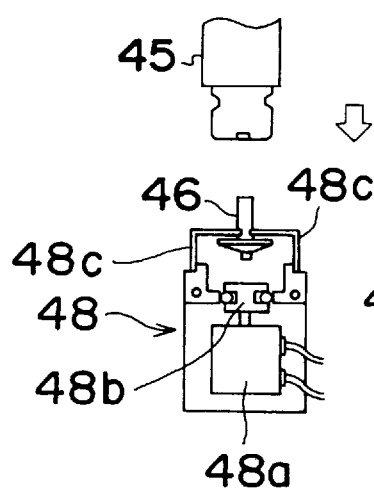
Figure 14E:
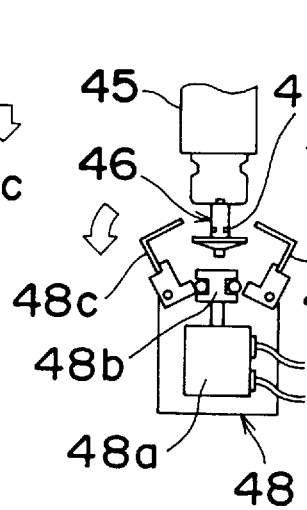
Figure 14F:
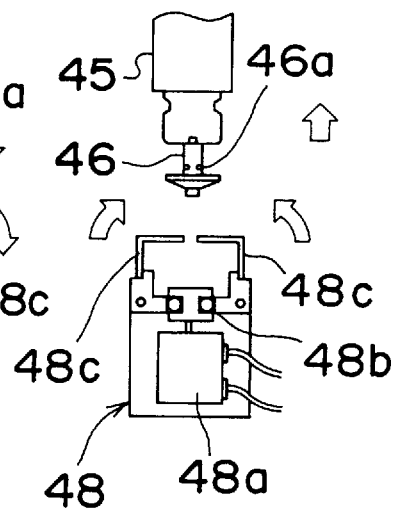

Also, a plurality of nozzles are prepared for suckioned and holding various types of electronic components at a nozzle replacement device 48, so that the head member 44 can select and set a nozzle suitable for the electronic component to be mounted. By setting the second reference pin 47 instead of the nozzle, the same work as in the foregoing embodiment can be carried out. That is, FIG. 14 shows the replacement operation according to a second embodiment of the present invention wherein a second reference pin 61 is replaceable with the suction nozzle 46, although the second reference pin 47 is not replaceable when held at the head member 44 in the first embodiment. After the printed board 1 has been completely regulated in its position and posture and securely held in the same way as in the foregoing embodiment, the head member 44 draws out the second reference pin 61 from the second reference hole 11, moving up to above a position of the nozzle replacement device 48. In the nozzle replacement device 48, a pair of engaging members 48c are rotatably arranged around shafts 48d, and when an air cylinder 48a is driven to move its piston rod 48b the engaging members 48c engaging with the piston rod 48b are rotated to be opened, as shown in FIGS. 14A and 14B. When the engaging members 48c of the replacement device 48 are opened, the nozzle mounting portion 45 is lowered, causing the second reference pin 61 to stop at its setting position. Then, when the engaging members 48c are rotated by moving down the piston rod 48b of the air cylinder 48a, and the engaging members 48c are closed to support the second reference pin 61, the nozzle mounting portion 45 is moved up, and the setting process is completed. At this time, ends of the engaging members 48c are inserted into and engaged with recesses 61a of the reference pin 61 to securely hold the reference pin 61 with the engaging members 48c, as shown in FIG. 14C. Next, the head member 44 moves to above another position of the nozzle replacement device 48 where a suitable nozzle of the nozzles 46 is stored, and then the nozzle mounting portion 45 is lowered so that the suitable nozzle 46 is set as shown in FIG. 14D. Subsequently, the engaging members 48c engaging with recesses 46a of the nozzle 46 are opened by moving up the piston rod 48c of the air cylinder 48a so as to release the holding of the nozzle 46 as shown in FIG. 14E, and thereafter the nozzle mounting portion 45 is moved up. The replacement device 48 makes the engaging members 48c closed by moving down the piston rod 48b of the air cylinder 48a as shown in FIG. 14F, and the replacement operation is completed at step 56 in FIG. 12.

Figure 2:
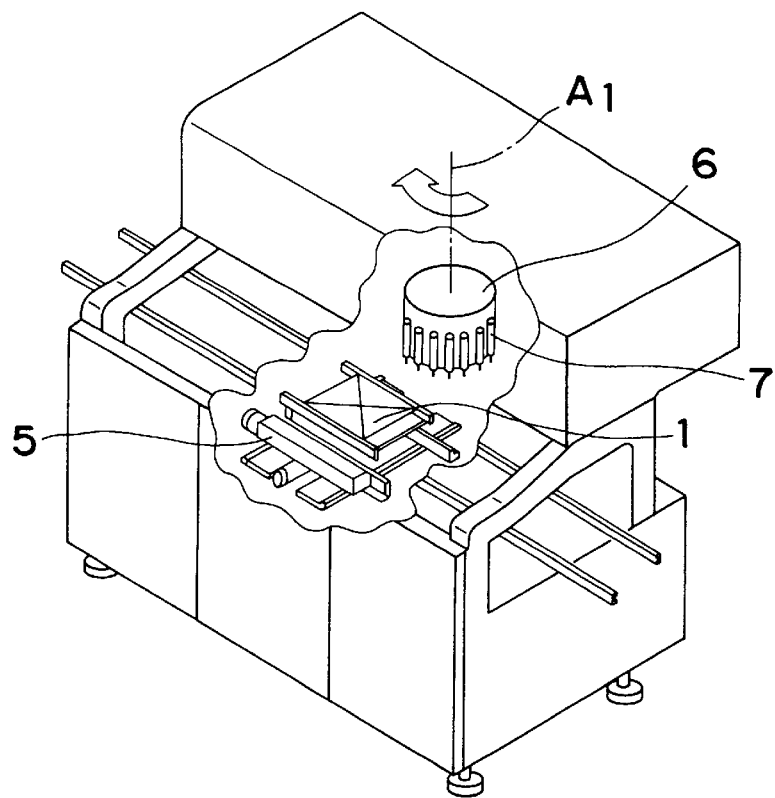
FIG. 2 is a partly broken perspective view of an electronic component mounter of a second type.
Figure 3:
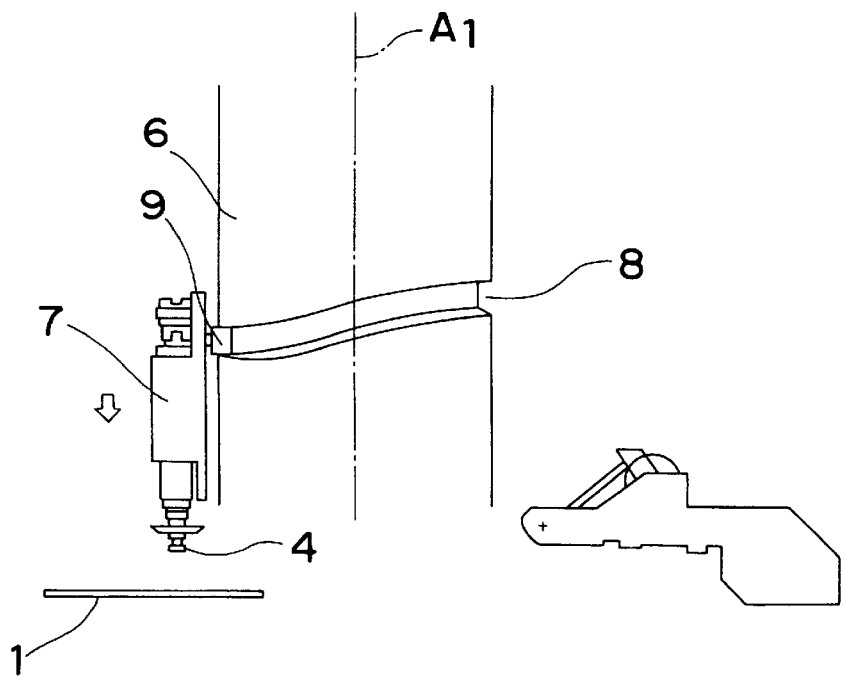
FIG. 3 is a schematic view showing the arrangement of a second-type electronic component mounter.
Figure 4:
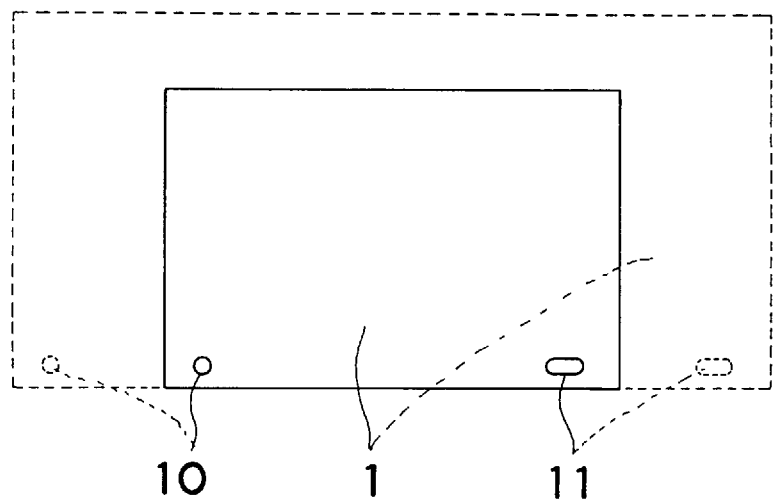
FIG. 4 is a schematic view of a printed board.
Figure 5:
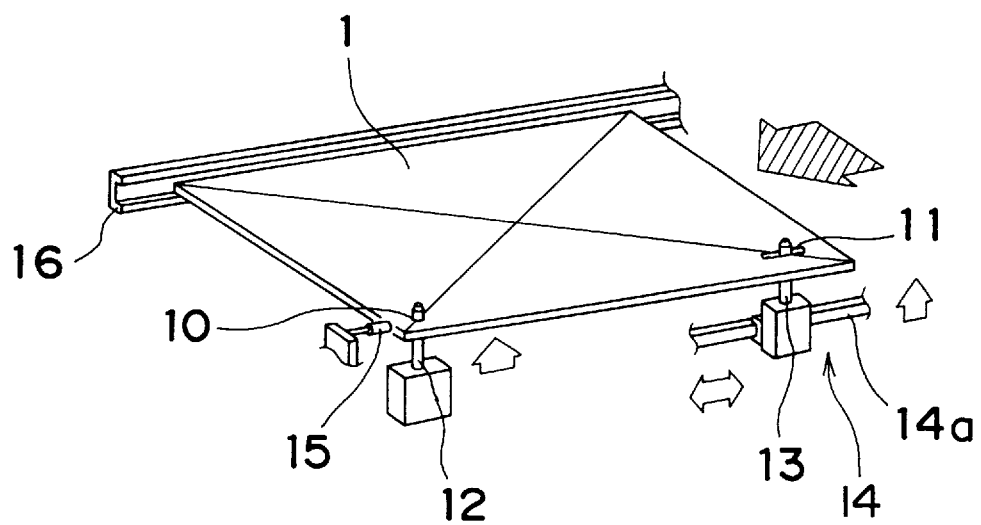
FIG. 5 is a perspective view showing the way in which the printed board is regulated.
Figure 6:
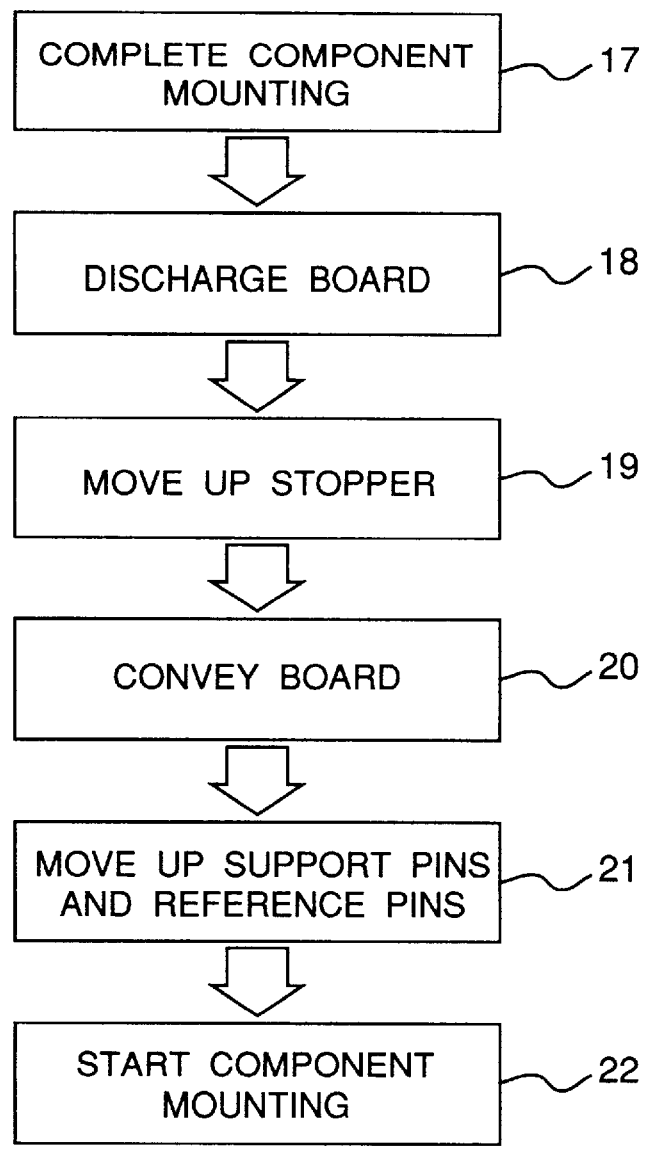
FIG. 6 is a flow chart showing the operation of a printed board supporting apparatus according to the prior art.
Figure 15:
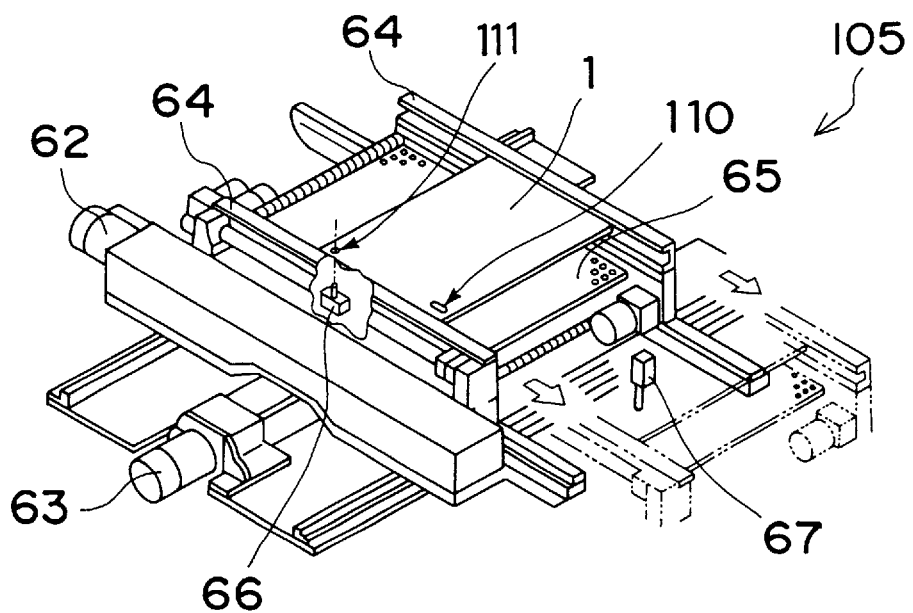
FIG. 15 is a perspective view of an X-Y table of a third embodiment of the present invention.
Figure 16:
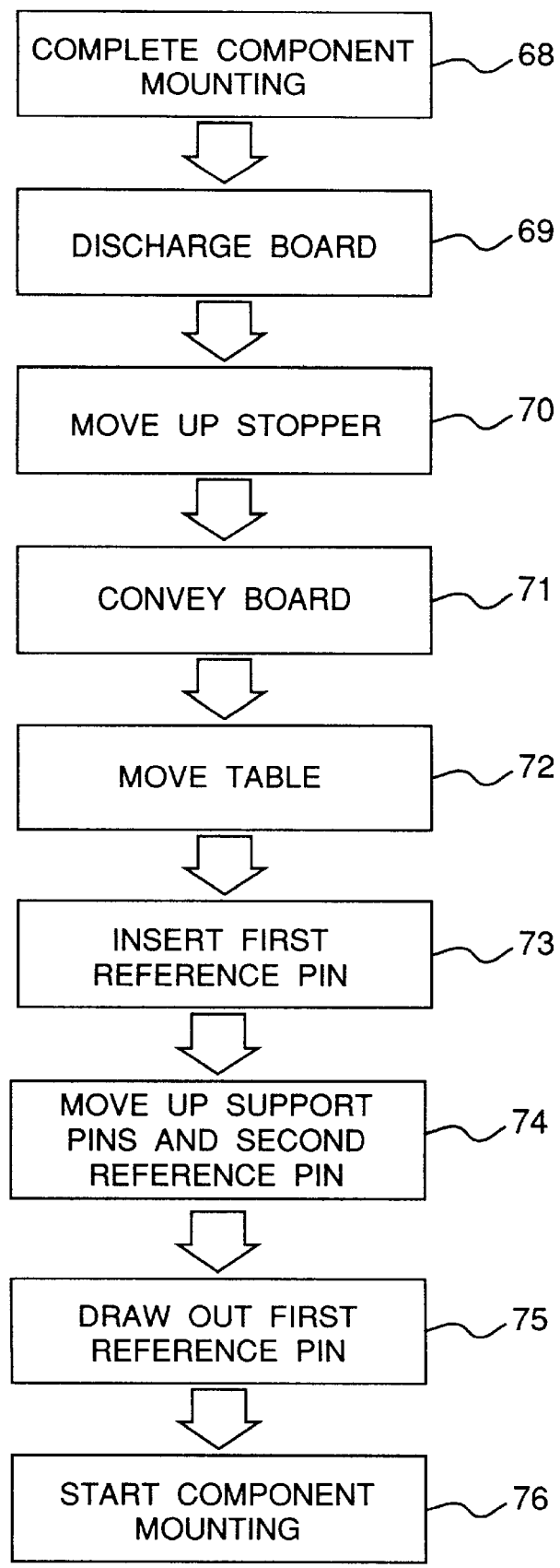
FIG. 16 is a flow chart showing the operation of a printed board supporting apparatus according to the third embodiment of the present invention.

Next, a third embodiment of the present invention will be described below. In the third embodiment, the present invention is applied to an electronic component mounter equipped with the X-Y table member 5 as shown in FIG. 2 that is planarly movable parallel to the mounting surface of the printed board 1. That is, FIG. 15 is a perspective view of an X-Y table member 105 according to the third embodiment of the present invention. The X-Y table member 105 holds and fixes a conveyed printed board 1, and moves it to a specified set position. The X-Y table member 105 includes an X-axis unit 62 and a Y-axis unit 63 provided parallel to the mounting surface and perpendicular to each other. The units 62 and 63 are equipped with drive units, conveyor rails 64 and conveyor belts (not shown) for conveying the printed board 1 along the conveyor rails 64. A stopper member (not shown, but corresponding to the stopper member 15 in the first embodiment) stops the printed board 1. A second reference pin 66 has a mechanism movable perpendicularly to the mounting surface, which is similar to the mechanism of the first reference pin 12 of the first embodiment. A back board 65 is for holding and fixing the printed board 1. Support pins are not shown, but corresponding to the support pins 26a in the first embodiment). A mounting portion (not shown but corresponding to the mounting portion 37) has the lifting mechanism for moving up and down via the supports pins etc. At a specified position outside the X-Y table member 105, a first reference pin 67 having a mechanism capable of moving the second reference pin 67 perpendicularly to the mounting surface is also provided, and can perform the same operation as described in the first embodiment. With the above arrangement of the third embodiment, the operation is described below. When the mounting of electronic components onto a printed board is completed at step 68 in FIG. 16, the conveyor members 64 discharge the printed board at step 69 in FIG. 16, and the stopper member for stopping the printed board 1 that is subsequently conveyed moves up at step 70 in FIG. 16. When the printed board 1 that is conveyed makes contact with the stopper member and thereby stops at step 71 in FIG. 16, the X-Y table member 105 moves to below the first reference pin 67 provided at the specified position at step 72 in FIG. 16, and the first reference pin 67 lowers so as to be inserted into a first reference hole (long hole) 110 of the board 1 at step 73 in FIG. 16. For the arrangement of the lifting mechanism or the like of the first reference pin 67, the method of FIG. 13 is applicable. Subsequently, as the back board 65 provided below the mounting surface of the printed board 1 moves up, the second reference pin 66 moves up, so that the second reference pin 66 is inserted into a second reference hole 111 of the printed board 1, thus regulating the position and posture of the printed board 1. Immediately after this, the support pins provided on the back board 65 and moving up make contact with the lower surface of the printed board 1. The support pins further lift the printed board 1 and pinch the board 1 with the conveyor rails 64, thereby holding and fixing the printed board 1 at step 74 in FIG. 16. When the holding of the printed board 1 is completed, the first reference pin 67 is drawn out from the first reference hole 110 at step 75 in FIG. 16, and the X-Y table member 105 is at the specified set position. Then, a group of a plurality of nozzles 7 provided on the cylindrical member 6 are intermittently rotated on the cylindrical member 6, mounting the electronic components one after another at step 76 in FIG. 16. Unshown mechanisms and operations in the above description are similar to the mechanisms and operations described in the prior art, and their description is omitted.

The above sequential operations in the embodiments are carried out at the most suitable timing by the control unit 800, provided at a specified position as shown in FIG. 18.

Figure 7A:
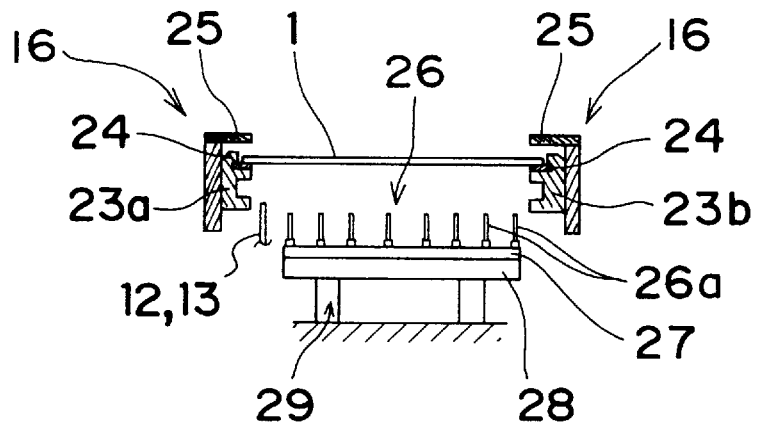
FIGS. 7A and 7B are schematic sectional views of the prior art printed board supporting apparatus, as viewed in a direction of board movement and from the front of the apparatus, respectively.
Figure 7B:
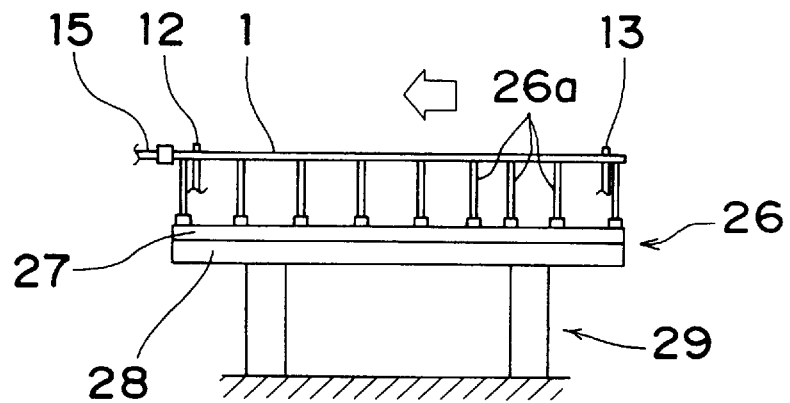
Figure 8:
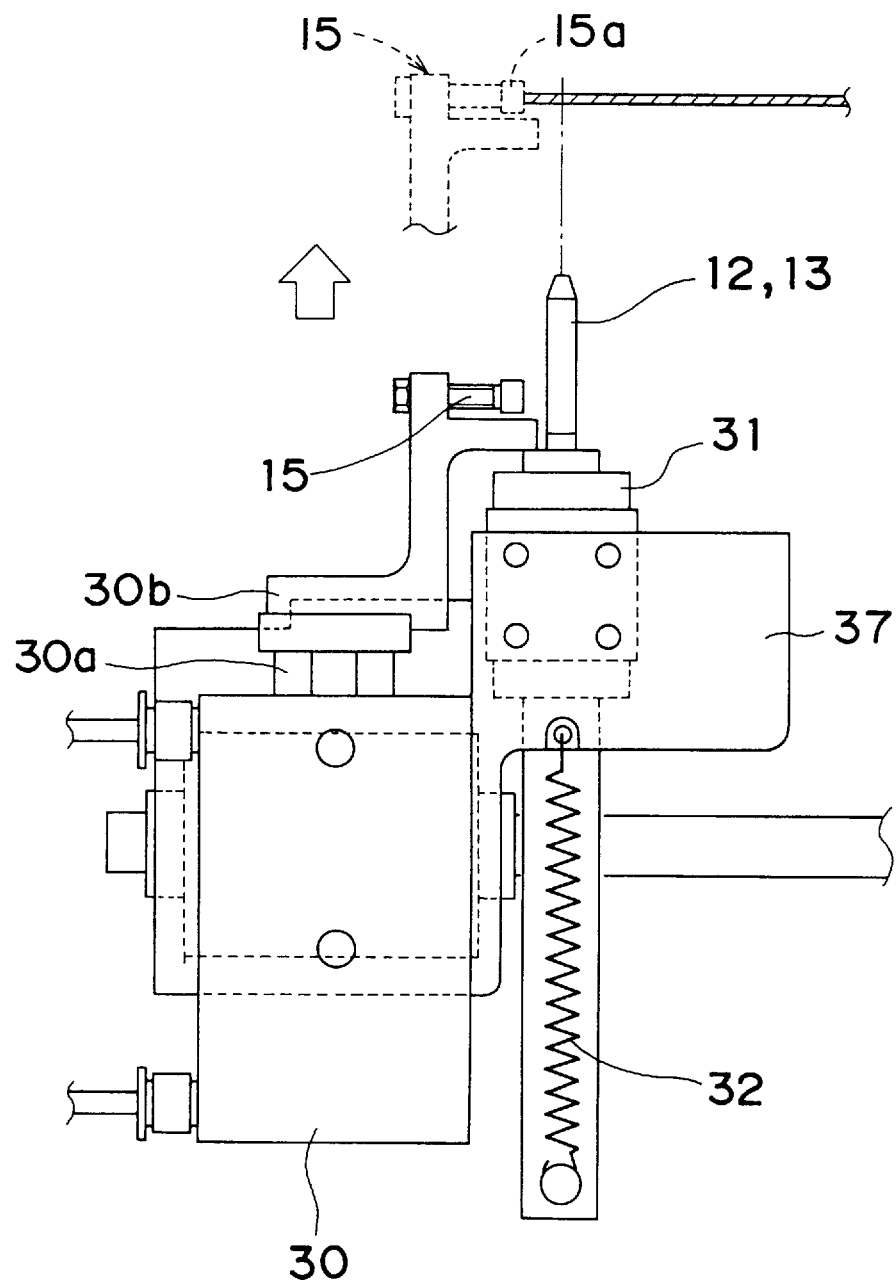
FIG. 8 is a schematic view showing the arrangement of a printed board stopper member and reference pins.
Figure 9:
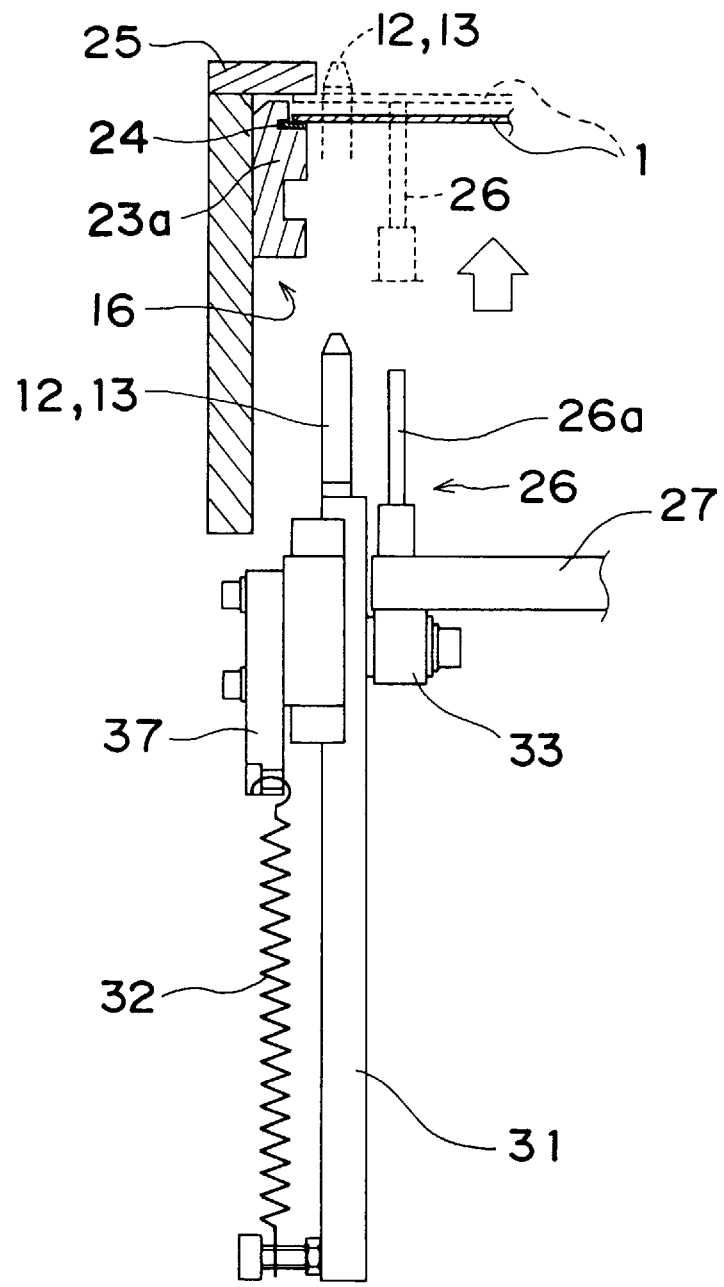
FIG. 9 is a schematic view showing the arrangement of the reference pins, to be inserted from under the printed board.
Figure 10A:
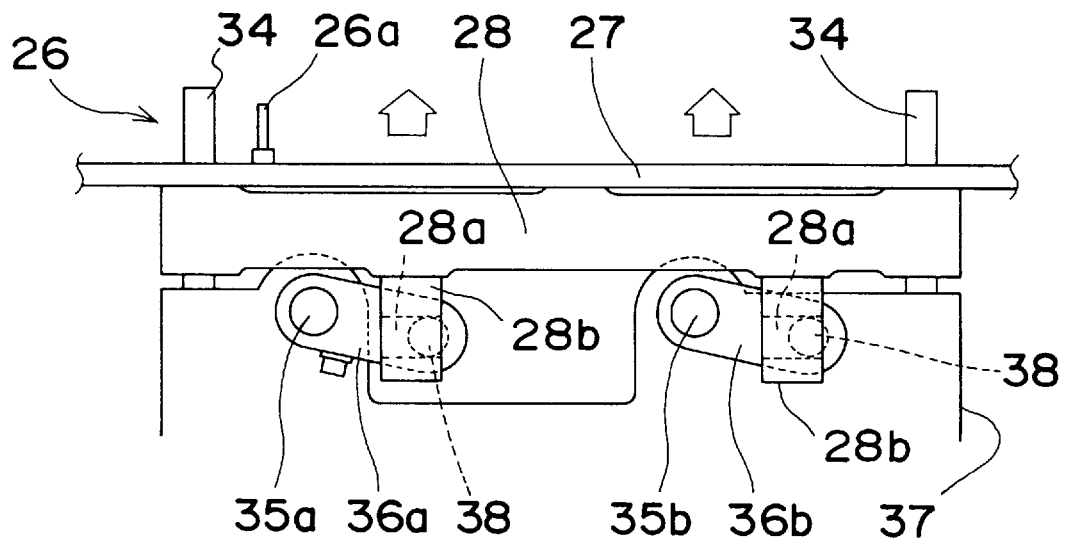
FIGS. 10A and 10B are schematic views showing the arrangement of the printed board support member.
Figure 10B:
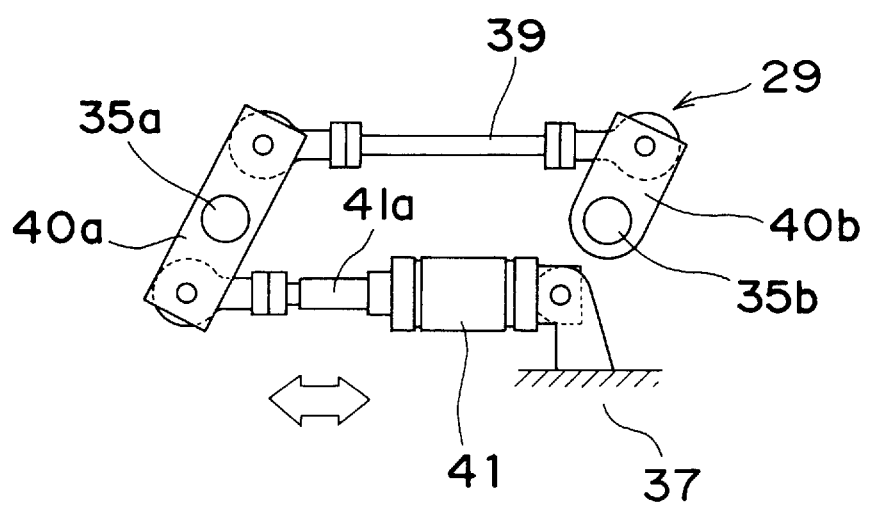
Figure 17:
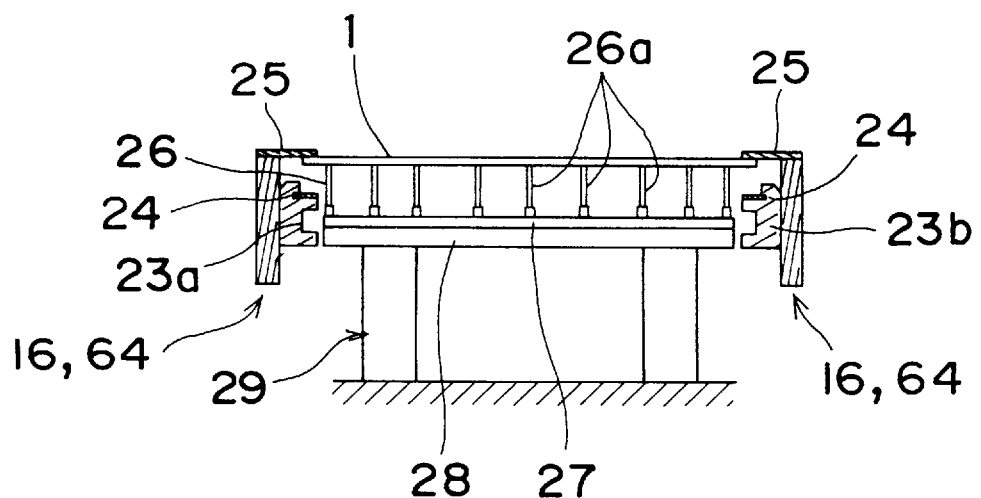
FIG. 17 is a sectional view showing as one example a state in which the printed board is supported by one of the printed board supporting apparatuses of the embodiments of the present invention.

As described above, the printed board supporting methods and apparatuses of the embodiments of the present invention obviate the need for a complicated pin shifting mechanism and the need of ensuring the space for movement which have been required in the prior art apparatus and method. Therefore, the support pins can be brought into a greater extent of contact with the lower surface of the printed board as shown in FIG. 17, allowing the mounting quality to be improved solving the problem of a lack of support of the printed board. The prior art apparatus has such a lack of support of the printed board as shown in FIG. 7A, because of the presence of the first and second reference pins 12, 13 below the printed board 1. Furthermore, there is no need to consider interference with the mounting nozzle, and a component-mountable area not less than that of the prior art can be assured, thereby allowing the limited space in the mounting apparatus to be effectively used. Furthermore, simplification of the mechanism as well as reduction of cost and weight can be achieved, offering advantages as a printed board supporting method and apparatus.

With the methods and apparatuses for supporting a printed board according to the embodiments of the present invention, a pin shifting mechanism can be additionally provided without newly providing any complex mechanism for planarly moving the second reference pin relative to the first reference pin.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A method for supporting a printed board, comprising:
   a first step of conveying to a specified position a printed board having a first reference hole and a second reference hole for setting a position and posture thereof;
   a second step of stopping the conveyed printed board at the specified position;
   a third step of inserting a first reference pin provided at the specified position in to the first reference hole of the stopped printed board;
   a fourth step of inserting a second reference pin in to the second reference hole of the printed board, the second reference pin being movable in parallel to a mounting surface of the printed board and in any arbitrary direction relative to the first reference pin;
   a fifth step of pinching the printed board to hold the position and posture thereof with the reference pin and the second reference pin both inserted;
   a sixth step of drawing out, after the fifth step, at least one reference pin of the first reference and the second reference pin from its corresponding reference hole; and
   a seventh step of mounting, after the sixth step, an electronic component onto the printed board.

2. The method for supporting a printed board according to claim 1, wherein in the third step and the fourth step, at least one reference pin of the first reference pin and the second reference pin is inserted into its corresponding reference hole from above the mounting surface of the printed board.

3. The method for supporting a printed board according to claim 1, further comprising an eighth step, between the sixth step and the seventh step, of replacing the drawn-out reference pin with an electronic component suction nozzle for suctioning the component to be mounted onto the printed board in the seventh step.

4. The method for supporting a printed board according to claim 1, wherein in the third step and the fourth step, at least one reference pin of the first reference pin and the second reference pin is inserted into its corresponding reference hole from above the mounting surface of the printed board, and the printed board is securely supported by supporting pins arranged at almost the whole area of a lower surface of the printed board, except for an area where the other reference pin of the first reference pin and the second reference pin is present in the seventh step.

5. The method for supporting a printed board according to claim 3, wherein in the third step and the fourth step, at least one reference pin of the first reference pin and the second reference pin is inserted into its corresponding reference hole from above the mounting surface of the printed board, and the printed board is securely supported, by supporting pins arranged at almost the whole area of a lower surface of the printed board, except for an area where the other reference pin of the first reference pin and the second reference pin is present in the seventh step.

6. An apparatus for supporting a printed board, comprising:
   a conveying device for conveying to a specified position a printed board having a first reference hole and a second reference hole for setting a position and posture of the printed board;
   a stop member for stopping the printed board at the specified position;
   a first reference pin provided at a specified position and being fittable to the first reference hole and movable perpendicularly to a mounting surface of the printed board;
   a second reference pin which is fittable to the second reference hole and movable perpendicularly to the mounting surface and which is provided in a device movable in parallel to the mounting surface and in any arbitrary direction relative to the first reference pin;
   a holding device for pinching end portions of the printed board to hold the position and posture thereof; and
   a control unit for controlling operations of the conveying device, the stop member, the first and second reference ping and the holding device in a sequence of operations.

7. The apparatus for supporting a printed board according claim 6, wherein the second reference pin is provided by a robot movable in parallel to the mounting surface of the printed board as the device movable in parallel to the mounting surface and in any arbitrary direction relative to the first reference pin.

8. The apparatus for supporting a printed board according to claim 6, wherein the second reference pin is removably retained by a robot, and the second reference pin is replaceable with an electronic component suction nozzle for suctioning a component to be mounted onto the printed board.

9. The apparatus for supporting a printed board according to claim 7, wherein the second reference pin is removably retained by the robot, and the second reference pin is replaceable with an electronic component suction nozzle for suctioning a component to be mounted onto the printed board.

10. The apparatus for supporting a printed board according to claim 6, wherein the first reference pin comprises a device movable perpendicularly to the mounting surface which is provided outside a table which holds the printed board and is movable in parallel to the mounting surface.

* * * * *